(12) United States Patent
Zhou

(10) Patent No.: US 11,222,909 B2
(45) Date of Patent: Jan. 11, 2022

(54) COMMON-GATE TRANSISTOR, PIXEL CIRCUIT, PIXEL STRUCTURE AND DISPLAY PANEL

(71) Applicant: EverDisplay Optronics (Shanghai) Co., Ltd, Shanghai (CN)

(72) Inventor: Xingyu Zhou, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 437 days.

(21) Appl. No.: 16/301,866

(22) PCT Filed: May 11, 2018

(86) PCT No.: PCT/CN2018/086545
§ 371 (c)(1),
(2) Date: Nov. 15, 2018

(87) PCT Pub. No.: WO2019/134324
PCT Pub. Date: Jul. 11, 2019

(65) Prior Publication Data
US 2021/0225228 A1 Jul. 22, 2021

(30) Foreign Application Priority Data
Jan. 5, 2018 (CN) .......................... 201810012354.6

(51) Int. Cl.
*H01L 27/12* (2006.01)
*H01L 27/088* (2006.01)
*G09G 3/32* (2016.01)
*G09G 3/20* (2006.01)

(52) U.S. Cl.
CPC ........... *H01L 27/1251* (2013.01); *G09G 3/20* (2013.01); *G09G 3/32* (2013.01); *H01L 27/088* (2013.01);
(Continued)

(58) Field of Classification Search
CPC .............. H01L 27/124; H01L 27/1255; H01L 27/1214; H01L 27/088; H01L 27/1225;
(Continued)

(56) References Cited

U.S. PATENT DOCUMENTS 9,613,955 B1 4/2017 Anderson et al.
2006/0055336 A1* 3/2006 Jeong .................. G09G 3/3233
315/169.3
(Continued)

FOREIGN PATENT DOCUMENTS

CN 1652167 A 8/2005
CN 101226958 A 7/2008
(Continued)

OTHER PUBLICATIONS

International Search Report dated Sep. 13, 2018 from PCT international application No. PCT/CN2018/086545.
(Continued)

*Primary Examiner* — Xuemei Zheng
(74) *Attorney, Agent, or Firm* — Qinghong Xu

(57) ABSTRACT

The present disclosure discloses a common-gate transistor, a pixel circuit, a pixel structure and a display panel, wherein the common-gate transistor includes: a first electrode region, a second electrode region and a third electrode region which are independently disposed, and a common gate region that is in contact with the first electrode region, the second electrode region, and the third electrode region; the common gate region, the first electrode region, and the second electrode region constitute a first transistor; and the common gate region, the first electrode region, and the third electrode region constitute a second transistor.

17 Claims, 11 Drawing Sheets

(52) U.S. Cl.
CPC ... *H01L 27/124* (2013.01); *G09G 2300/0819* (2013.01); *G09G 2330/028* (2013.01)

(58) Field of Classification Search
CPC .......... H01L 27/1251; H01L 27/11558; H01L 27/1222; H01L 27/1211; H01L 27/127; H01L 27/1266; H01L 27/12; G09G 3/3233; G09G 3/3648; G09G 2300/0809; G09G 2300/0439; G09G 3/32; G09G 3/20
See application file for complete search history.

(56) References Cited

U.S. PATENT DOCUMENTS

2006/0244695 A1* 11/2006 Komiya ................. G09G 3/006
 345/76

2013/0240886 A1* 9/2013 Yeh ..................... H01L 27/1251
 257/57

FOREIGN PATENT DOCUMENTS

| CN | 101252131 A | 8/2008 |
| CN | 103681866 A | 3/2014 |
| CN | 103715086 A | 4/2014 |
| CN | 107016956 A | 8/2017 |
| CN | 107038987 A | 8/2017 |
| EP | 0818819 A1 | 1/1998 |

OTHER PUBLICATIONS

1st Office Action dated Apr. 17, 2019 from CN patent application No. 201810012354.6.
Notification of Decision of Reexamination dated May 11, 2020 from CN patent application No. 201810012354.6.

* cited by examiner

COMMON-GATE TRANSISTOR, PIXEL CIRCUIT, PIXEL STRUCTURE AND DISPLAY PANEL

CROSS-REFERENCE TO RELATED APPLICATION

This application is the 371 application of PCT Application No. PCT/CN2018/086545, filed May 11, 2018, which is based upon and claims priority to Chinese Patent Application No. 201810012354.6, filed Jan. 5, 2018, the entire contents of which are incorporated herein by reference.

TECHNICAL FIELD

The present disclosure relates to the technical field of electronic display, and in particular, to a common-gate transistor, a pixel circuit, a pixel structure, and a display panel.

BACKGROUND

In the circuit design, the common-gate transistor is a popular transistor structure. For example, a popular mirror transistor is a special common-gate transistor, and a structure of at least one group of mirror transistors is included in a circuit such as a constant current source circuit and a differential circuit. In the circuit fabrication, there are two independent transistors, and gates of the two transistors are electrically connected to each other.

However, the common-gate transistor is one group of transistors, which occupy a position of two transistors in circuit fabrication, thereby increasing the area of the associated circuit on the circuit board, which is not conducive to improving the integration of the circuit board.

In summary, the existing common-gate transistor has a problem that the occupied area is too large.

SUMMARY

The present disclosure provides a common-gate transistor, a pixel circuit, a pixel structure and a display panel for reducing the occupation area of the common-gate transistor in the pixel structure.

Embodiments of the present disclosure provide a common-gate transistor, including:

a first electrode region, a second electrode region, and a third electrode region that are independently disposed, and a common gate region that is in contact with the first electrode region, the second electrode region, and the third electrode region;

wherein the common gate region, the first electrode region, and the second electrode region constitute a first transistor; and the common gate region, the first electrode region, and the third electrode region constitute a second transistor.

Alternatively, the second electrode region and the third electrode region are of the same electrical property.

Alternatively, the second electrode region and the third electrode region are symmetrically disposed on both sides of the common gate region.

Alternatively, the common gate region includes a first gate region and a second gate region;

a gate region of the first transistor includes the first gate region; and a gate region of the second transistor includes the first gate region and the second gate region.

The embodiments of the present disclosure provide a pixel circuit, including any one of the above-mentioned common-gate transistors, wherein the pixel circuit includes: a compensation unit, a driving unit, a light emitting unit, a capacitor, and an external power source;

the compensation unit is electrically connected to the driving unit through a first node; the external power source, the driving unit and the light emitting unit are sequentially connected in series; and the capacitor is connected between the first node and the external power source;

the compensation unit is configured to receive a data signal and a first scan signal, and the compensation unit is configured to set a voltage of the first node to a first voltage under an influence of the first scan signal, the first voltage being a voltage obtained by compensating a voltage of the data signal by a compensation transistor in the compensation unit;

the capacitor is configured to maintain the voltage of the first node at the first voltage;

the driving unit is configured to receive a first control signal, and the driving unit is configured to generate a driving current to drive the light emitting unit to emit light according to the first control signal; the driving current being obtained according to the first voltage, the external power source, and a threshold voltage of a driving transistor in the driving unit; the compensation transistor is the first transistor, and the driving transistor is the second transistor.

Alternatively, the driving unit includes an isolation transistor, a driving transistor and a light emitting control transistor connected in series from the external power source to the light emitting unit through a source and a drain;

both gates of the light emitting control transistor and the isolation transistor are configured to receive the first control signal.

Alternatively, the pixel circuit further includes an initialization unit;

the initialization unit is connected between the first node and the light emitting unit, and the initialization unit is configured to receive a second scan signal and an initialization voltage; and the initialization unit is configured to initialize the first node and the light emitting unit using the initialization voltage under a control of the second scan signal.

The embodiments of the present disclosure provide a pixel structure being applied to any one of the above-mentioned pixel circuits, the pixel structure further including:

a driving-side electrode extension region that extends from the first electrode region of the driving transistor; and a third electrode extension region that extends from the third electrode region;

wherein the driving-side electrode extension region overlaps with a first control signal line of the first control signal at a gate region of the isolation transistor, and a side of the driving-side electrode extension region away from the common gate region is connected with an external power source signal line of the external power source; and the third electrode extension region overlaps with the first control signal line at a gate region of the light emitting control transistor, and a side of the third electrode extension region away from the common gate region is connected with the light emitting unit.

Alternatively, a metal plate is disposed above the common gate region; and the metal plate is one of capacitor plates of the capacitor;

the pixel structure further includes:

a compensation-side electrode extension region that extends from the first electrode region of the compensation transistor, and a second electrode extension region that extends from the second electrode region;

an overlapping region between the compensation-side electrode extension region and a first scan signal line of the first scan signal constitutes a gate region of a data strobe transistor; and a side of the compensation-side electrode extension region away from the common gate region is externally connected with a data signal line of the data signal; and an overlapping region between the second electrode extension region and the first scan signal line constitutes a gate region of the switching transistor; and a side of the second electrode extension region of the first scan signal line away from the common gate region is electrically connected to the metal plate.

Alternatively, the pixel structure further includes:

a driving-side electrode extension region that extends from the first electrode region of the driving transistor; and a third electrode extension region that extends from the third electrode region;

wherein the driving-side electrode extension region overlaps with a first control signal line of the first control signal at a gate region of the light emitting control transistor, and a side of the driving-side electrode extension region away from the common gate region is connected to the light emitting unit; and the third electrode extension region overlaps with the first control signal line at a gate region of the isolation transistor, and a side of the third electrode extension region away from the common gate region is connected to an external power source signal line of the external power source signal.

Alternatively, a metal plate is disposed above the common gate region; and the metal plate is one of capacitor plates of the capacitor;

the pixel structure further includes:

a compensation-side electrode extension region that extends from the first electrode region of the compensation transistor, and a second electrode extension region that extends from the second electrode region;

wherein an overlapping region between the compensation-side electrode extension region and a first scan signal line of the first scan signal constitutes a gate region of the switching transistor; and a side of the compensation-side electrode extension region away from the common gate region is electrically connected to the metal plate; and an overlapping region between the second electrode extension region and the first scan signal line constitutes a gate region of data strobe transistor; and a side of the second electrode extension region of the first scan signal line away from the common gate region is externally connected to a data signal line of the data signal.

The embodiments of the present disclosure provide a display panel, including: any of the above-mentioned common-gate transistors, and/or any of the above-mentioned pixel circuits, and/or any of the above-mentioned pixel structure.

In summary, the embodiments of the present disclosure provide a common-gate transistor, a pixel circuit, a pixel structure, and a display panel, wherein the common-gate transistor includes: a first electrode region, a second electrode region, and a third electrode region that are independently disposed; and a common gate region that is in contact with the first electrode region, the second electrode region and the third electrode region; the common gate region, the first electrode region and the second electrode region constitute a first transistor; and the common gate region, the first electrode region and the third electrode region constitute a second transistor. With the above scheme, the first transistor and the second transistor, which are used as the common-gate transistor, share the common gate region, thereby saving space of one gate region. Moreover, since the first transistor and the second transistor share the common gate region as the gate region, and share the first electrode region as the source region or the drain region, partial electrical parameters of the first transistor and the second transistor have a relatively high similarity, so as to achieve a more ideal co-gate effect.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure, and those skilled in the art can also obtain other drawings based on these drawings without paying inventive labor.

DETAILED DESCRIPTION

Figure 1:
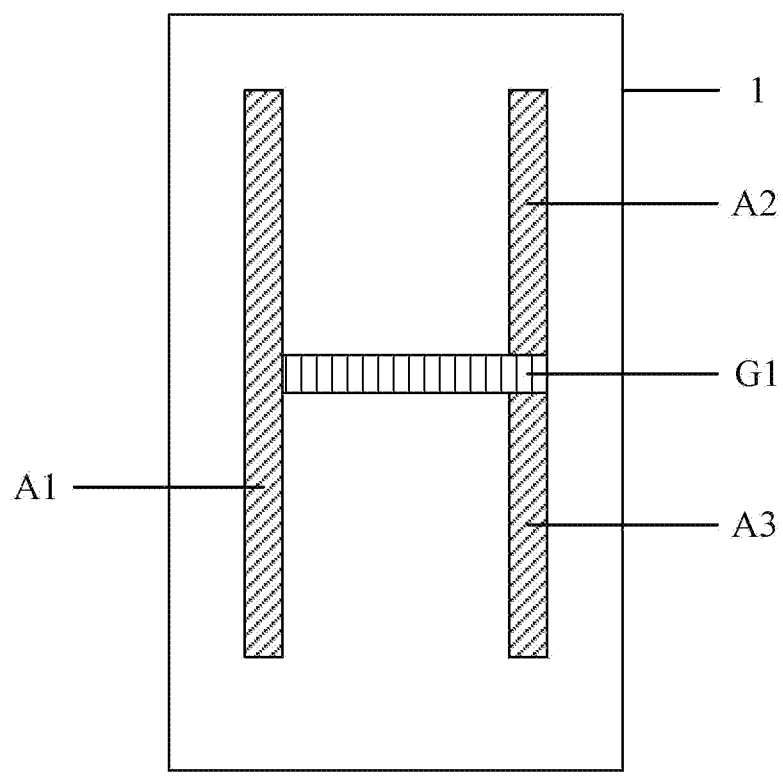
FIG. 1 is a schematic structural diagram of a feasible common-gate transistor according to an embodiment of the present disclosure.

In order to make the purposes, technical solutions and advantages of the present disclosure to be clearer, the present disclosure will be further described in detail with reference to the accompanying drawings. It is apparent that the described embodiments are only part of the embodiments of the present disclosure, rather than all the embodiments. All other embodiments obtained by those skilled in the art based on the embodiments of the present disclosure without creative efforts are within the scope of the present disclosure.

The embodiments of the present disclosure provide a common-gate transistor, including: a first electrode region, a second electrode region, and a third electrode region that are independently disposed, and a common gate region that is in contact with the first electrode region, the second electrode region, and the third electrode region; the common gate region, the first electrode region, and the second electrode region constitute a first transistor; and the common gate region, the first electrode region, and the third electrode region constitute a second transistor. In a specific implementation process, electrical properties of majority carrier of the common gate region are opposite to electrical properties of majority carriers of the first electrode region, the second electrode region, and the third electrode region. For example, if the majority carrier of the common gate region is a hole, then the majority carriers of the first electrode region, the second electrode region, and the third electrode region are electrons. It should be understood that parasitic transistors are inevitably present in the common-gate transistor provided by the embodiments of the present disclosure. For example, the second electrode region, the third electrode region, and the common gate region may constitute a parasitic transistor. Although the embodiments of the present disclosure describe the structure of the common-gate transistor by the first transistor and the second transistor, the case of realizing other transistor functions by the present structure should also be included in the embodiments of the present disclosure.

Optionally, the electrical properties of the second electrode region and the third electrode region are the same. The electrical properties of the second electrode region and the third electrode region refer to properties exhibited by the second electrode region and the third electrode region in the transistor circuit, and the electrical properties of the second electrode region and the third electrode region are related to various factors, such as doping concentrations of the two electrode regions, positions of the doped regions, and structures of the doped regions. In the embodiments of the present disclosure, the electrical properties of the second electrode region and the third electrode region are the same, so that more electrical parameters of the first transistor and the second transistor have relatively high similarities, and thus the common gate effect is better.

In order to more specifically describe the common-gate transistor provided by the embodiments of the present disclosure, the following embodiments of the present disclosure provide following two feasible implementations for explanation.

First Feasible Common-Gate Transistor Structure

FIG. 1 is a schematic structural diagram of a feasible common-gate transistor according to an embodiment of the present disclosure. As shown in FIG. 1, a common-gate transistor is deposited on a substrate 1, and includes a first electrode region A1, a second electrode region, and a third electrode region A3 which are independently disposed, and a common gate region G1 in contact with the first electrode region A1, the second electrode region A2 and the third electrode region A3; the second electrode region A2 and the third electrode region A3 are symmetrically disposed on both sides of the common gate region G1; the common gate region G1, the first electrode region A1 and the second electrode region A2 constitute a first transistor; and the common gate region G1, the first electrode region A1 and the third electrode region A3 constitute a second transistor. The second electrode region A2 and the third electrode region A3 are symmetrically disposed on both sides of the common gate region G1, so that the second electrode region A2 and the third electrode region A3 have the completely same gate region, thereby improving the similarity between the first transistor and the second transistor, resulting in a better common-gate effect.

Second Feasible Common-Gate Transistor Structure

Figure 2:
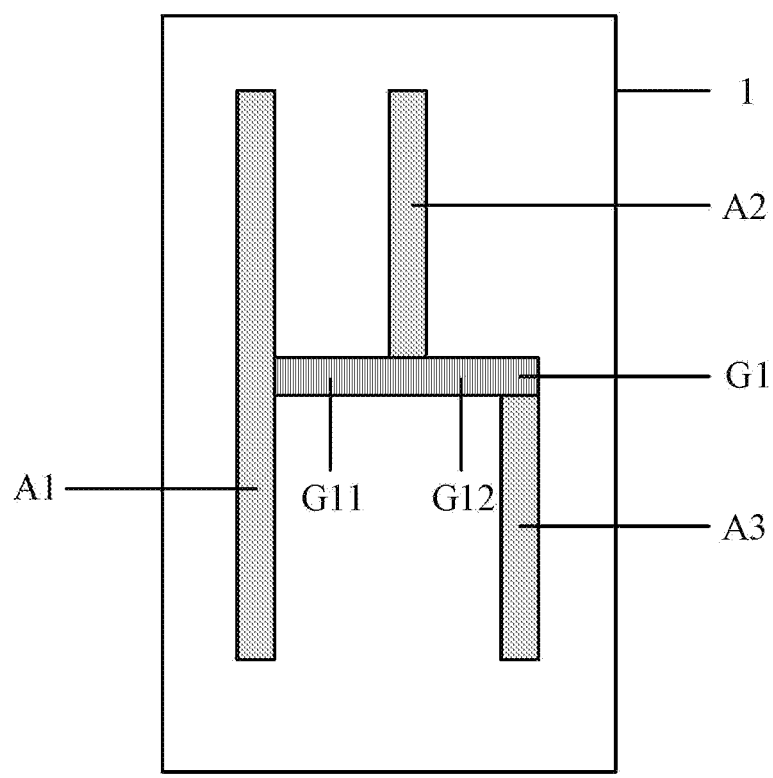
FIG. 2 is a schematic structural diagram of another feasible common-gate transistor according to an embodiment of the present disclosure.

FIG. 2 is a schematic structural diagram of another feasible common-gate transistor according to an embodiment of the present disclosure. As shown in FIG. 2, a common-gate transistor is deposited on a substrate 1, and includes a first electrode region A1, a second electrode region A2, and a third electrode region A3 that are independently disposed, and a common gate region G1 in contact with the first electrode region A1, the second electrode region A2, and the third electrode region A3; the second electrode region A2 and the third electrode region A3 are disposed on two sides of the common gate region G1; the common gate region G1, the first electrode region A1 and the second electrode region A2 constitute a first transistor; and the common gate region G1, the first electrode region A1 and the third electrode region A3 constitute a second transistor. In FIG. 2, the common gate region G1 includes a first gate region G11 and a second gate region G12; a gate region of the first transistor includes the first gate region G11; and a gate region of the second transistor includes the first gate region G11 and the second gate region G12. It should be understood that G11 and G12 may be integrally formed, and have the same material, width, etc., and the embodiments of the present disclosure are described by G11 and G12, respectively, so as to reflect the positional relationship between the second electrode region A2 and the third electrode region A3. The width of the gate region of the first transistor is smaller than that of the second transistor, thus an output current of the first transistor is larger, which can meet the use requirements of some special circuits. For example, when the first transistor is a compensation transistor of the pixel circuit, since the output current of the first transistor is larger, the data signal writing can be completed in a relatively short time, thereby making the display panel more suitable for high-resolution screen display.

Figure 3:
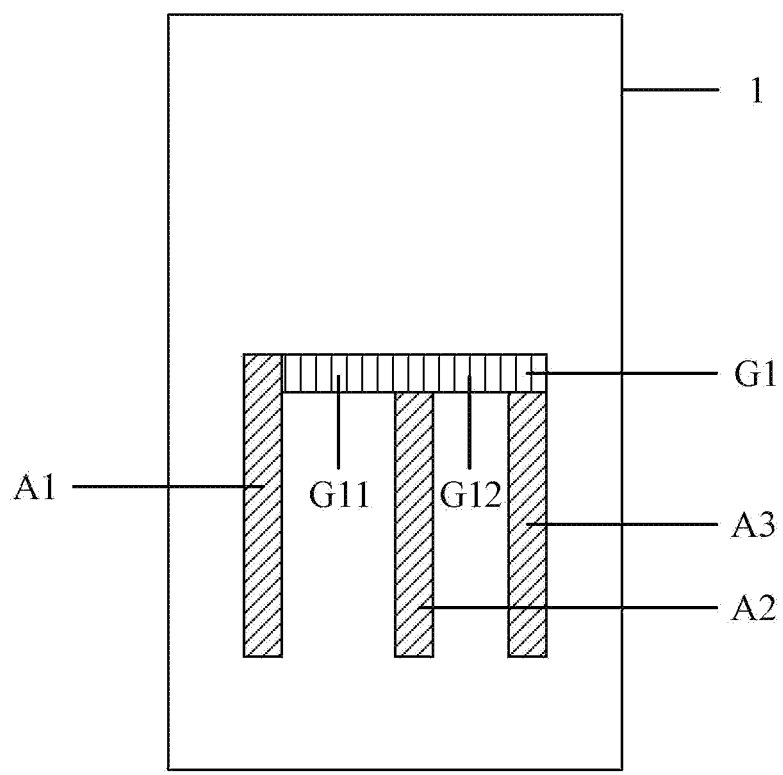
FIG. 3 is a schematic structural diagram of another feasible common-gate transistor according to an embodiment of the present disclosure.

Similar to the second feasible common-gate transistor structure shown in FIG. 2, the embodiments of the present disclosure also provide a third feasible common-gate transistor structure. FIG. 3 is a schematic structural diagram of another feasible common-gate transistor according to an embodiment of the present disclosure. As shown in FIG. 3, a common-gate transistor is deposited on a substrate 1, and includes a first electrode region A1, a second electrode region A2 and a third electrode region A3 that are independently disposed, and a common gate region G1 in contact with the first electrode region A1, the second electrode region A2, and the third electrode region A3; the second electrode region A2 and the third electrode region A3 are disposed on the same side of the common gate region G1; the common gate region G1, the first electrode region A1 and the second electrode region A2 constitute a first transistor; and the common gate region G1, the first electrode region A1 and the third electrode region A3 constitute a second transistor. The common-gate transistor shown in FIG. 3 can achieve similar effects to the common-gate transistor shown in FIG. 2, and can also meet the needs of some special circuits. In the specific implementation process, the above three common-gate transistor structures can be flexibly used according to actual conditions.

In summary, an embodiment of the present disclosure provides a common-gate transistor, including: a first electrode region, a second electrode region, and a third electrode region that are independently disposed, and a common gate region in contact with the first electrode region, the second electrode region, and the third electrode region; the common gate region, the first electrode region and the second electrode region constitute a first transistor; and the common gate region, the first electrode region and the third electrode region constitute a second transistor. With the above scheme, the first transistor and the second transistor, which are used as the common-gate transistor, share a common gate region, thereby saving space of one gate region. Moreover, since the first transistor and the second transistor share the common gate region as the gate region, and share the first electrode region as a source region or a drain region, partial electrical parameters of the first transistor and the second transistor have relatively high similarity, thereby achieving a more ideal common gate effect.

Figure 4:
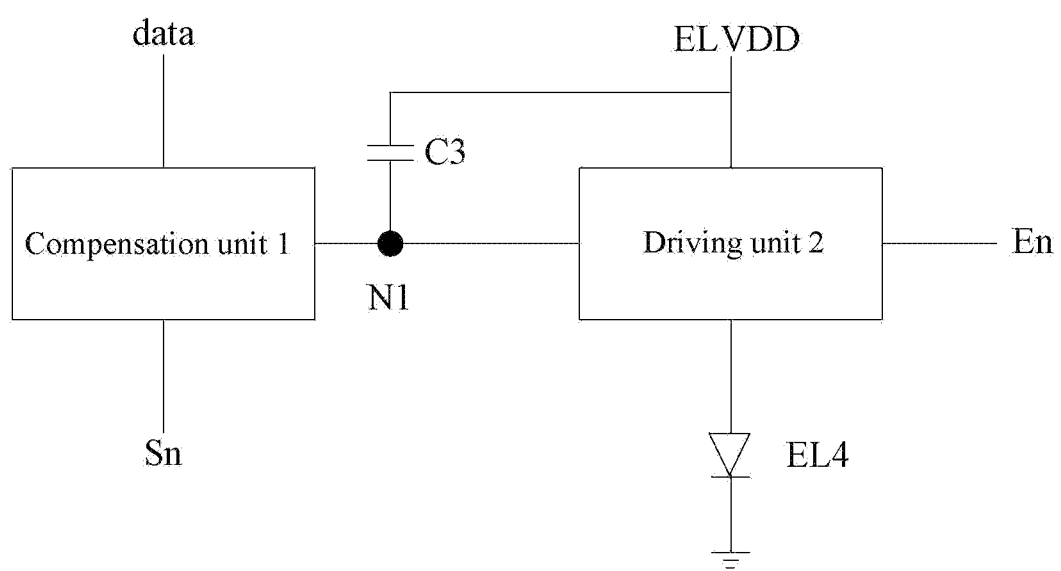
FIG. 4 is a schematic structural diagram of a pixel circuit according to an embodiment of the present disclosure.

Based on the same technical concept, the embodiments of the present disclosure further provide a pixel circuit, and the pixel circuit includes the common-gate transistor provided by any of the above embodiments. FIG. 4 is a schematic structural diagram of a pixel circuit according to an embodiment of the present disclosure. As shown in FIG. 4, the pixel circuit includes: a compensation unit 1, a driving unit 2, an LED unit EL4, a capacitor C3, and an external power source ELVDD; the compensation unit 1 is electrically connected to the driving unit 2 via a node N1; the external power source ELVDD, the driving unit 2 and the light emitting unit EL4 are sequentially connected in series; the capacitor C3 is connected between the first node N1 and the external power source ELVDD; the compensation unit 1 is configured to receive a data signal data and a first scan signal Sn, the compensation unit 1 is configured to set a voltage of the first node N1 to a first voltage ($V_{data} +_{di} V_{thT1}$) in response to the first scan signal Sn, wherein $V_{thT1}$ is a threshold voltage of a compensation transistor in the compensation unit 1; the capacitor C3 is used to maintain the voltage of the first node N1 as the first voltage ($V_{data}+V_{thT1}$); the driving unit 2 is configured to receive a first control signal En, and the driving unit 2 is configured to generate a driving current to drive the light emitting unit to emit light according to the first control signal En; when the first control signal En controls the driving unit 2 to be turned on, the driving unit 2 generates a driving current to drive the light emitting unit EL4 to emit light; the driving current is obtained according to the first voltage ($V_{data}+V_{thT1}$), the external power source ELVDD, and the threshold voltage of the driving unit 2. At this time, the magnitude of the driving current $I_{EL4}$ flowing through the light emitting unit EL4 is as shown in the formula 1:

$$I_{EL4} = \frac{1}{2}\mu C_{OX} \frac{W}{L}(V_{ELVDD} - V_{N1} + V_{thT2})^2 \quad \text{(formula 1)}$$

$V_{ELVDD}$ is a voltage of the external power supply ELVDD, $V_{N1}$ is the first voltage and $V_{thT2}$ is the threshold voltage of the driving transistor. The compensation transistor is the first transistor in the above embodiments, and the driving transistor is the second transistor in the above embodiments. Since the driving transistor and the compensation transistor are the common-gate transistor, the threshold voltage of the driving transistor and the threshold voltage of the compensation transistor T1 have the same trend of change, that is, $V_{thT1}-V_{thT2}=A$, A is a constant. Thus, the formula 1 may be further transformed into:

$$I_{EL} = \frac{1}{2}\mu C_{OX} \frac{W}{L}(V_{ELVDD} - V_{data} - A)^2 \quad \text{(formula 2)}$$

Thereby, the influence of the threshold current of the driving transistor on the light emitting diode is eliminated. Further, in the pixel circuit shown in FIG. 4, the data signal data is connected to the compensation unit 1, and the ELVDD is connected to the driving unit 2, so that in the data writing phase, the data signal data is written by the compensation unit 1 into the first node N1, and in the light-emitting phase, the ELVDD is connected to the driving unit 2, and the data signal data is isolated from the external power source ELVDD, thereby avoiding the influence of the external power source ELVDD on the data signal data, and improving the light-emitting stability of the light emitting transistor. In the specific implementation, internal structures of the compensation unit 1 and the driving unit 2 are not specifically limited in the embodiments of the present disclosure, and all the pixel circuits satisfying the functions and interactions of the compensation unit 1 and the driving unit 2 in the above embodiments shall be included in the embodiments of the present disclosure.

In the pixel circuit shown in FIG. 4, when the compensation transistor and the driving transistor adopt the common-gate transistor as shown in FIG. 1, a difference between the threshold voltages of the compensation transistor and the driving transistor is very small, and the compensation effect of the threshold voltage is good.

In the pixel circuit shown in FIG. 4, when the compensation transistor and the driving transistor adopt the common-gate transistor as shown in FIG. 2, the compensation transistor can have a relatively large output current in the data writing phase, and thus data writing can be completed in a relatively short time, making the display panel more suitable for high-resolution screen display.

Figure 5:
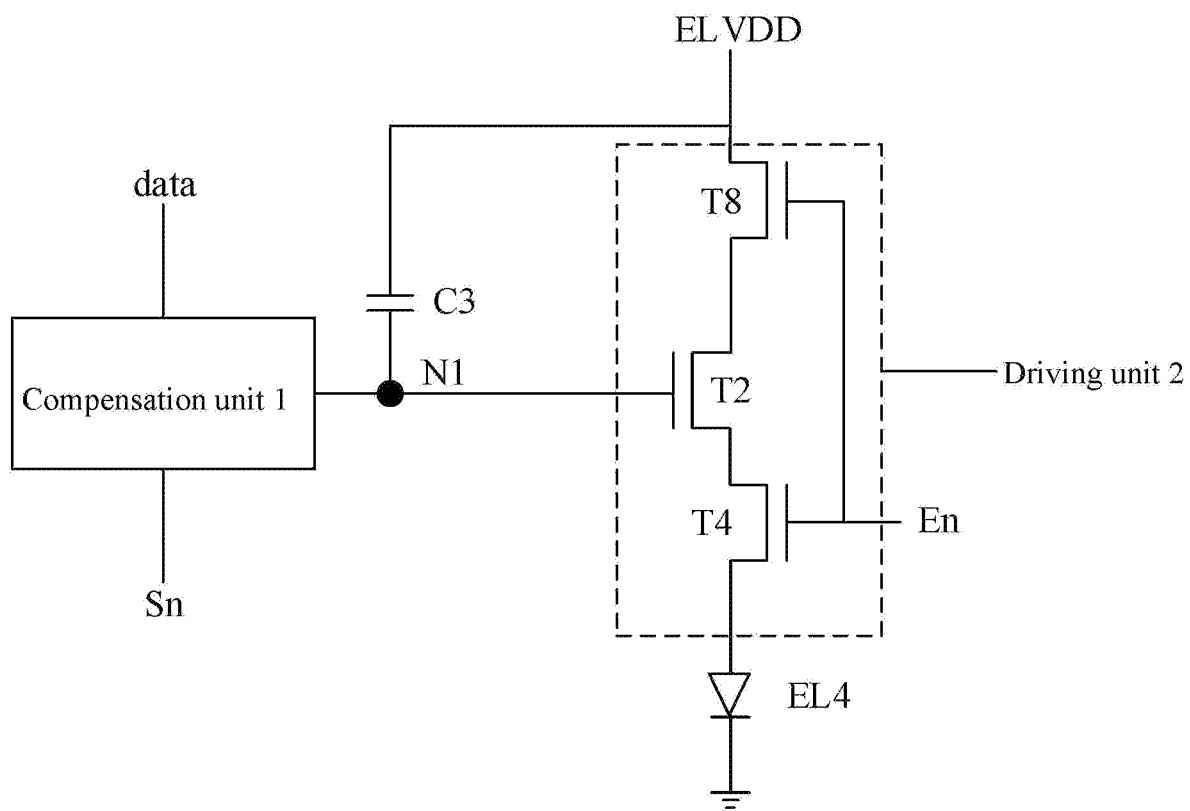
FIG. 5 is a schematic structural diagram of a feasible pixel circuit according to an embodiment of the present disclosure.

Optionally, the embodiments of the present disclosure further provide a feasible implementation of the driving unit. FIG. 5 is a schematic diagram of a feasible pixel circuit structure provided by the embodiments of the present disclosure. In FIG. 5, the driving unit 2 includes an isolation transistor T8, a driving transistor T2 and a light emitting control transistor T4 sequentially connected in series from the external power source ELVDD to the light emitting unit EL4 through sources and drains; gates of the light emitting control transistor T4 and the isolation transistor T8 are configured to receive the first control signal En. In the data writing phase, the first scan signal Sn controls the compensation unit 1 to be turned on, and the data signal data is written into the first node N1, corresponding to the common gate region G1 in FIG. 1 or FIG. 2. At this time, the first control signal En controls the isolation transistor to be turned off, thus, the external power supply signal ELVDD cannot enter the common gate region G1, thereby avoiding the influence of the external power supply signal ELVDD on the data signal data, and further improving the light-emitting stability of the light-emitting diode.

Figure 6:
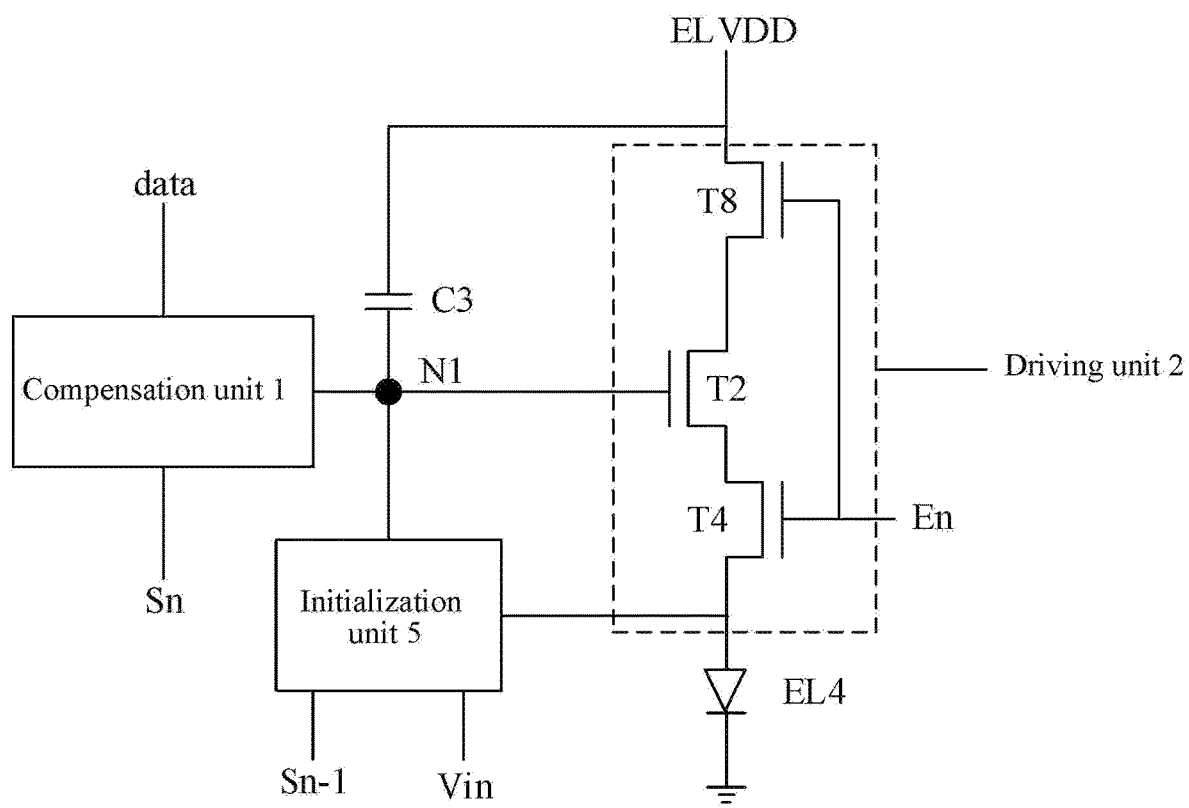
FIG. 6 is a schematic structural diagram of a pixel circuit with an initialization function according to an embodiment of the present disclosure.

Optionally, the pixel circuit provided by the embodiments of the present disclosure further includes an initialization unit. FIG. 6 is a schematic diagram of a pixel circuit structure with an initialization function according to an embodiment of the present disclosure. As shown in FIG. 6, an initialization unit 5 is further included. The initialization unit 5 is connected between the first node N1 and the light emitting unit EL4, the initialization unit 5 is configured to receive a second scan signal Sn-1 and an initialization voltage Vin; and the initialization unit 5 is used for initializing the first node N1 and the light emitting unit EL4 using the initialization voltage Vin under the control of the second scan signal Sn-1. When the second scan signal Sn-1 turns on the initialization unit 5, the initialization unit 5 inputs the initialization voltage Vin to the first node N1 and the light emitting unit EL4, and the capacitor C3 is discharged until the voltage drops to Vin, thereby realizing the initialization of the first node N1 and the light emitting unit EL4. The initialization may release the voltage at N1, ensuring that the data signal data can be written into the node N1 during the next data writing phase. The internal structure of the initialization unit 5 is not specifically limited in the embodiments of the present disclosure, and the pixel circuit that satisfies the functions of the initialization unit 5 and its interaction with the compensation unit 1 and the driving unit 2 in the above embodiments should be included in the embodiments of the present disclosure. In a specific implementation process, Vin may be a single initialization signal, or may be a second scan signal Sn-1. At this time, when the second scan signal Sn-1 turns on a first initialization transistor T6 and a second initialization transistor T7, the initialization transistor T6 and the second initialization transistor T7 are in a saturated state, and the second scan signal is input to the first node N1 and an anode of the light emitting unit EL4 via the first initialization transistor T6 and the second initialization transistor T7, respectively, until the first initialization transistor T6 and the second initialization transistor T7 are turned off, thereby completing the initialization of the first node N1 and the light emitting unit EL4.

Figure 7:
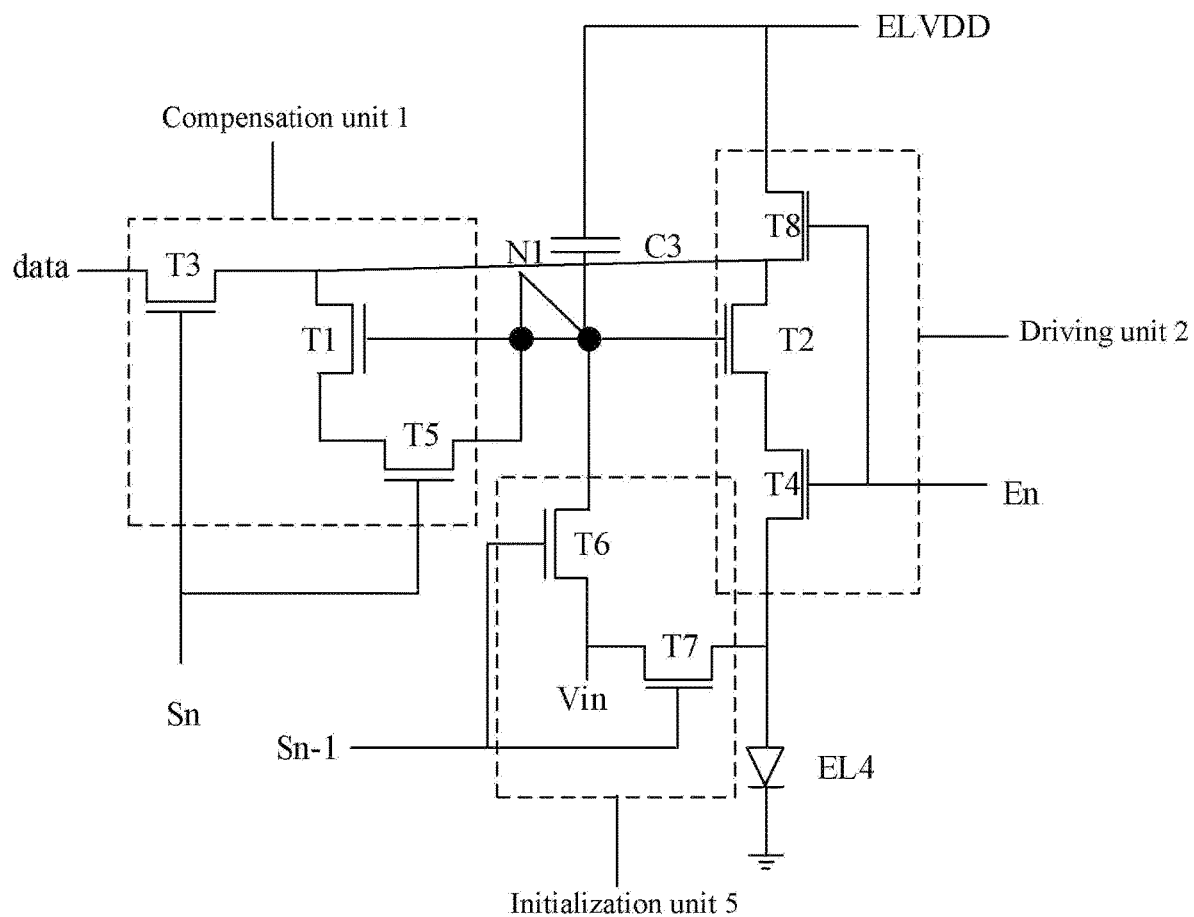
FIG. 7 is a schematic structural diagram of a feasible pixel circuit according to an embodiment of the present disclosure.

In order to more specifically describe the technical solutions provided by the embodiments of the present disclosure, the embodiments of the present disclosure further provide a specific feasible pixel circuit structure. FIG. 7 is a schematic diagram of a feasible pixel circuit structure provided by an embodiment of the present disclosure. As shown in FIG. 7, following descriptions are given.

The compensation unit 1 includes a data strobe transistor T3, a compensation transistor T1 and a switching transistor T5. The driving unit 2 includes a driving transistor T2 and a light emitting control transistor T4. The initialization unit 5 includes a first initialization transistor T6 and a second initialization transistor T7.

In the compensation unit 1, a drain of the data strobe transistor T3 is electrically connected to a source of the compensation transistor T1, a source of the data strobe transistor T3 is electrically connected to the data signal data; a gate of the data strobe transistor T3 is electrically connected to the first scan signal Sn; a gate of the compensation transistor T1 is electrically connected to a gate of the driving transistor T2 through the first node N1, and a drain of the compensation transistor T1 is electrically connected to a source of the switching transistor T5. A drain of the switching transistor T5 is electrically connected to the gate of the compensation transistor T1, and a gate of the switching transistor T5 is electrically connected to the first scan signal Sn.

In the driving unit 2, a source of the isolation transistor T8 is externally connected to the external power supply ELVDD, a gate of the isolation transistor T8 is configured to receive the first control signal En, a drain of the isolation transistor T8 is electrically connected to a source of the driving transistor T2; a drain of the driving transistor T2 is electrically connected to a source of the light emitting control transistor T4; a drain of the light emitting control transistor T4 is electrically connected to the light emitting unit EL4, and a gate of the light emitting control transistor T4 is configured to receive the first control signal En. Moreover, since the driving transistor T2 and the compensating transistor T1 share the first electrode region in the common-gate transistor, the source of the driving transistor T2 and the source of the compensating transistor T1 are electrically connected in the pixel circuit.

In the initialization unit 5, a source of the first initialization transistor T6 is configured to receive the initialization voltage Vin; a drain of the first initialization transistor T6 is electrically connected to the first node N1; a gate of the first initialization transistor T6 is electrically connected to the second scan signal Sn-1; a source of the second initialization transistor T7 is configured to receive the initialization voltage Vin; a drain of the second initialization transistor T7 is electrically connected to the light emitting unit EL4; and a gate of the second initialization transistor T7 is electrically connected to the second scan signal Sn-1.

The capacitor C3 is connected between the first node N1 and the external power source ELVDD.

Figure 8:
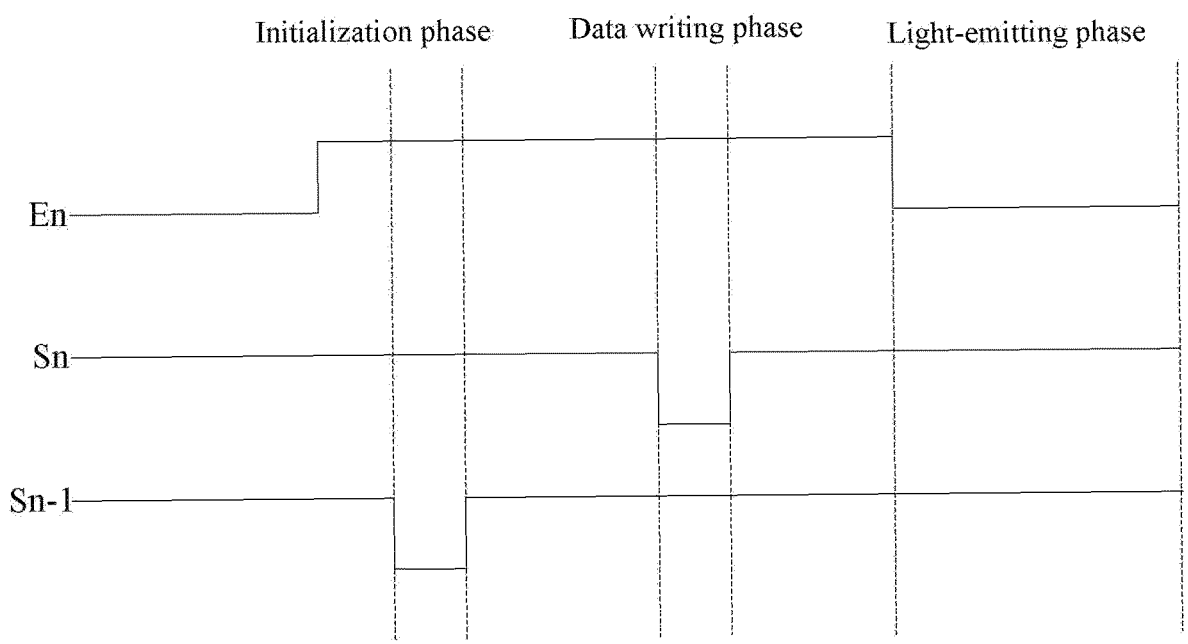
FIG. 8 is a schematic diagram of a driving signal according to an embodiment of the present disclosure.

When each transistor in FIG. 7 is a P-channel MOS transistor (Positive channel Metal Oxide Semiconductor, PMOS), it may be driven by the driving signal as shown in FIG. 8. FIG. 8 is a schematic diagram of a driving signal according to an embodiment of the present disclosure.

In the initialization phase, the first scan signal Sn is at a high level, causing the data strobe transistor T3 and the switching transistor T5 to be turned off, and the compensation unit 1 is turned off. The first control signal En is at a high level, causing the light emitting control transistor T4 and the isolation transistor T8 to be turned off, and the driving unit 2 is turned off. The second control signal Sn-1 is at a low level, causing the first initialization transistor T6 and the second initialization transistor T7 to be turned on, and T6 passes the initialization voltage Vin to the first node N1, thereby initializing the first node N1, and T7 transmits the voltage Vin to the light emitting unit EL4, thereby initializing the light emitting unit EL4.

In the data writing phase, the first scan signal Sn is at a low level, causing the data strobe transistor T3 and the switching transistor T5 to be turned on, and the compensation unit 1 is turned on. The first control signal En is at a high level, causing the light emitting control transistor T4 and the isolation transistor T8 to be turned off, and the driving unit 2 is turned off. The second scan signal Sn-1 is at a high level, causing the first initialization transistor T6 and the second initialization transistor T7 to be turned off, and the initialization unit 5 is turned off. The data signal data reaches the source of the compensation transistor T1 via the data strobe transistor T3. Since the switching transistor T5 is turned on, the compensation transistor T1 operates in the saturation area, and the data signal data is written into the first node N1 until the voltage of the first node N1 reaches the first voltage ($V_{data}+V_{thT1}$) then the compensation transistor T1 is turned off.

In the light emitting phase, the first scan signal Sn is at a high level, causing the data strobe transistor T3 and the switching transistor T5 to be turned off, and the compensation unit 1 is turned off. The first control signal En is at a low level, causing the light emitting control transistor T4 and the isolation transistor T8 to be turned on, and the driving unit 2 is turned on. The second scan signal Sn-1 is at a high level, causing the first initialization transistor T6 and the second initialization transistor T7 to be turned off, and the initialization unit 5 is turned off. The driving transistor T2 generates a driving current to drive the light emitting unit EL4 to emit light. Since the voltage of the first node N1 is the first voltage ($V_{data}+V_{thT1}$), the gate voltage of the driving transistor T2 may be threshold-compensated, so that the driving current is no longer affected by the threshold drift of the driving transistor T2.

It should be understood that the first electrode region may also serve as the drain of the compensation transistor T1 and the driving transistor T2. In this case, in the schematic diagram of the circuit structure, the drains of the compensation transistor T1 and the driving transistor T2 should be electrically connected, and the working principle of the circuit structure in this case is the same as that of the circuit structure in which the sources are electrically connected (as shown in FIG. 7), which will not be described in detail in the embodiments of the present disclosure.

Based on the same technical concept, an embodiment of the present disclosure provides a pixel structure, which may be applied to the pixel circuit provided by any of the above embodiments.

Figure 9:
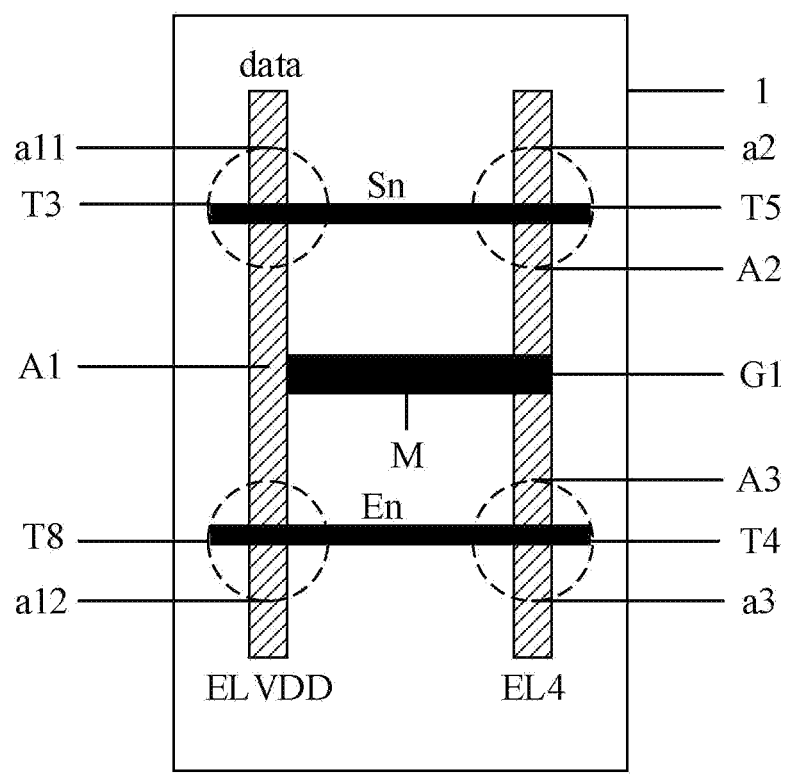
FIG. 9 is a schematic diagram of a specific feasible pixel structure according to an embodiment of the present disclosure.

Optionally, the embodiments of the present disclosure further provide a specific feasible pixel structure for description. FIG. 9 is a schematic diagram of a feasible pixel structure according to an embodiment of the present disclosure, and FIG. 9 shows a case where sources of the first transistor and the second transistor are connected. In FIG. 9, the common-gate transistor (it is the same for the common-gate transistor shown in FIG. 2) shown in FIG. 1 is included, wherein the first transistor is the compensation transistor T1, the second transistor is the driving transistor T2, and a driving-side electrode extension region a12 having an extending relationship with the first electrode region A1 of the driving transistor T2 (i.e., the driving-side electrode extension region a1 that extends from the first electrode region A1 of the driving transistor T2), and a third electrode extension region a3 that extends from the third electrode region A3 are further included; and the driving-side electrode extension region a12 overlaps with the first control signal line at the gate region of the isolation transistor T8, and a side of the driving-side electrode extension region a12 away from the common gate region G1 is connected to the external power supply signal line; the third electrode extension region a3 overlaps with the first control signal line at the gate region of the light emitting transistor T4, and a side of the third electrode extension region a3 away from the common gate region G1 is connected to the light emitting unit EL4. In a specific implementation process, an insulating dielectric layer is further spaced between the first control signal line and the driving-side electrode extension region a12 as well as the third electrode extension region a3, and the third electrode extension region may be electrically connected to the light emitting unit EL4 by forming a via hole on the insulating dielectric layer, which are common knowledge in the field of semiconductors, and the description is not described in detail in the present disclosure.

Optionally, as shown in FIG. 9, a metal plate M is disposed above the common gate region G1, and the metal plate M may serve as a common gate of the driving transistor and the compensation transistor, and may also serve as one of capacitor plates of the capacitor C3 in FIG. 4. As shown in FIG. 9, the pixel structure further includes: a compensation-side electrode extension region a11 that extends from the first electrode region A1 of the compensation transistor T1, and a second electrode extension region that extends from the second electrode region A2; an overlapping region between the compensation-side electrode extension region a11 and the first scan signal line constitutes the gate region of the data strobe transistor T3; a side of the compensation-side electrode extension region a11 away from the common gate region G1 is externally connected to the data signal line; an overlapping region between the second electrode extension region a2 and the first scan signal line constitutes a gate region of the switching transistor T5; a side of the second electrode extension region a2 of the first scan signal line away from the common gate region is electrically connected to the metal plate M (not shown). During the implementation, the first scan signal line and the compensation-side electrode extension region a11 and the second electrode extension region a2 are further separated by an insulating dielectric layer, and the electrical connection between the second electrode extension region a2 and the metal plate may be realized by multilayer metal interconnection, i.e., by depositing a dielectric layer over the structure shown in FIG. 9 to realize electrical connection between the second electrode extension region a2 and the metal plate M through interlayer interconnection.

Figure 10:
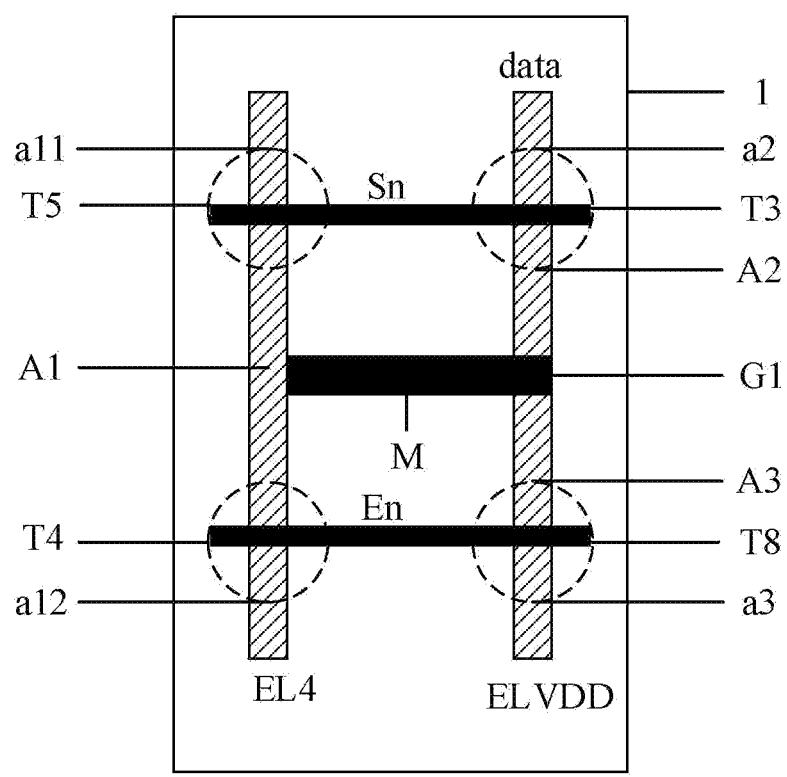
FIG. 10 is a schematic diagram of another specific feasible pixel structure according to an embodiment of the present disclosure.

Optionally, the embodiments of the present disclosure further provide another feasible pixel structure for description. FIG. 10 is a schematic diagram of another feasible pixel structure according to an embodiment of the present disclosure. FIG. 10 is a view showing a case where sources of the first transistor and the second transistor are connected. In FIG. 10, a common-gate transistor (it is the same for the common-gate transistor shown in FIG. 2) is included, wherein the first transistor is the compensation transistor T1, the second transistor is the driving transistor T2, and a driving-side electrode extension region a12 that extends from the driving transistor T2 of the first electrode region A1 and a third electrode extension region a3 that extends from the third electrode region A3 are included; and the driving-side electrode extension region a12 overlaps with the first control signal line at the gate region of the light emitting control transistor T4, a side of the driving-side electrode extension region a12 away from the common gate region G1 is connected to the light emitting unit EL4; the third electrode extension region a3 overlaps with the first control signal line at a gate region of the isolation transistor T8, a side of the third electrode extension region a3 away from the common gate region G1 is connected to the external power supply signal ELVDD. In a specific implementation process, an insulating dielectric layer is further spaced between the first control signal line and the driving-side electrode extension region a12 and the third electrode extension region a3, and the driving-side electrode extension region a12 may be electrically connected to the light emitting unit EL4 by forming a via in the insulating dielectric layer.

Optionally, as shown in FIG. 10, a metal plate M is disposed above the common gate region G1, and the metal plate M may serve as a common gate of the driving transistor and the compensation transistor, and may also serve as one of capacitor plates of the capacitor C3 in FIG. 4. As shown in FIG. 10, the pixel structure further includes: a compensation-side electrode extension region a11 that extends from the first electrode region A1 of the compensation transistor T1, and a second electrode extension region that extends from the second electrode region A2; an overlapping region between the compensation-side electrode extension region a11 and the first scan signal line constitutes a gate region of the switching transistor T5; a side of the compensation-side electrode extension region a11 away from the common gate region G1 is electrically connected to the metal plate M; an overlapping region between the second electrode extension region a2 and the first scan signal line constitutes a gate region of the data strobe transistor T3; and a side of the second electrode extension region a2 of the first scan signal line away from the common gate region is externally connected to the data signal line. During the implementation, the first scan signal line and the compensation-side electrode extension region a11 and the second electrode extension region a2 are further separated by an insulating dielectric layer, and the electrical connection between the compensation-side electrode extension region a11 and the metal plate may be realized by multilayer metal interconnection, i.e., by depositing a dielectric layer over the structure shown in FIG. 10, and achieving the electrical connection between the compensation-side electrode extension a11 and the metal plate M by interlayer interconnection.

Figure 11:
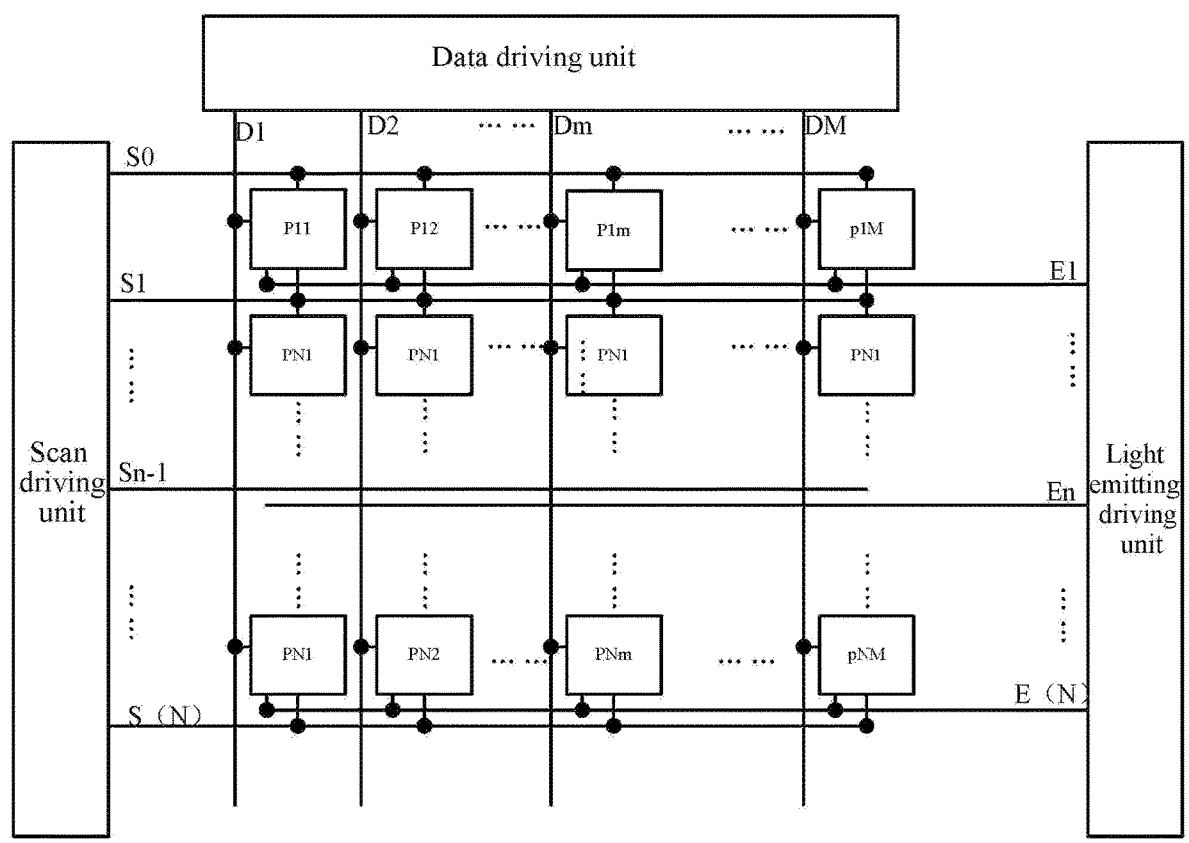
FIG. 11 is a schematic structural diagram of a display panel according to an embodiment of the present disclosure.

Based on the same technical concept, the embodiments of the present disclosure further provide a display panel, including the common-gate transistor provided by any of the above embodiments, and/or the pixel circuit provided by any of the above embodiments, and/or the pixel structure provided by any of the above embodiments. FIG. 11 is a schematic structural diagram of a display panel according to an embodiment of the present disclosure. In FIG. 11, the display includes a N×M pixel circuit array, and the scan driving unit generates scan signals S0, S1, S2, . . . , SN, and Sn is a scan signal inputted by the scan driving unit into the $n^{th}$ row pixel, n=1, 2, . . . N; the data driving unit generates data signals data, including D1, D2 . . . DM, total of M data signals, respectively corresponding to M columns of pixels, Dm is the data signal data of the $m^{th}$ column of pixels, m=1, 2, . . . M; the light emitting driving unit generates the first control signals E1, E2, . . . EN, En is the first control signal inputted by the light emitting driving unit into the $n^{th}$ row pixel, n=1, 2, . . . N.

In summary, the embodiments of the present disclosure provide a common-gate transistor, a pixel circuit, a pixel structure, and a display panel, wherein the common-gate transistor includes: a first electrode region, a second electrode region, and a third electrode region that are independently disposed, and a common gate region in contact with the first electrode region, the second electrode region and the third electrode region; the second electrode region and the third electrode region are disposed on two sides of the common gate region respectively; the common gate region, the first electrode region and the second electrode region constitute a first transistor; and the common gate region, the first electrode region and the third electrode region constitute a second transistor. With the above scheme, the first transistor and the second transistor, which are used as the common-gate transistor, share a common gate region, thereby saving space of one gate region. Moreover, since the first transistor and the second transistor share the common gate region as the gate region, and share the first electrode region as the source region or the drain region, partial electrical parameters of the first transistor and the second transistor have a high similarity, so as to achieve a more ideal common gate effect.

Although the embodiments of the present disclosure have been described, it will be understood that the person skilled in the art can make other modification and amendments to these embodiments upon learning the basic inventive concept. Therefore, the appended claims are intended to be interpreted as including the embodiments and all the modifications and amendments falling within the scope of the present disclosure.

It will be apparent that those skilled in the art can make various modifications and variations to the disclosure without departing from the spirit and scope of the disclosure. Thus, it is intended that the present disclosure cover the modifications and modifications of the disclosure.

What is claimed is:

1. A common-gate transistor, comprising:
a first electrode region, a second electrode region, and a third electrode region that are independently disposed, and a common gate region that is in contact with the first electrode region, the second electrode region, and the third electrode region;
wherein the common gate region, the first electrode region, and the second electrode region constitute a first transistor; and
the common gate region, the first electrode region, and the third electrode region constitute a second transistor,
wherein a first gate region and a second gate region constitute the common gate region; the first gate region constitutes a gate region of the first transistor; and the first gate region and the second gate region constitute a gate region of the second transistor.

2. The common-gate transistor of claim 1, wherein the second electrode region and the third electrode region are of the same electrical property.

3. The common-gate transistor of claim 1, wherein the second electrode region and the third electrode region are symmetrically disposed on two sides of the common gate region.

4. A pixel circuit, comprising a common-gate transistor, wherein the common-gate transistor comprises: a first electrode region, a second electrode region, and a third electrode region that are independently disposed, and a common gate region that is in contact with the first electrode region, the second electrode region, and the third electrode region;
the common gate region, the first electrode region, and the second electrode region constitute a first transistor; and
the common gate region, the first electrode region, and the third electrode region constitute a second transistor,
wherein a first gate region and a second gate region constitute the common gate region; the first gate region constitutes a gate region of the first transistor; and the first gate region and the second gate region constitute a gate region of the second transistor, and
wherein the pixel circuit further comprises: a compensation unit, a driving unit, a light emitting unit, a capacitor, and an external power source;
the compensation unit is electrically connected to the driving unit through a first node; the external power source, the driving unit and the light emitting unit are sequentially connected in series; and the capacitor is connected between the first node and the external power source;
the compensation unit is configured to receive a data signal and a first scan signal, and the compensation unit is configured to set a voltage of the first node to a first voltage in response to the first scan signal, the first voltage being a voltage obtained by compensating a voltage of the data signal by a compensation transistor in the compensation unit;
the capacitor is configured to maintain the voltage of the first node at the first voltage;
the driving unit is configured to receive a first control signal, and the driving unit is configured to generate a driving current to drive the light emitting unit to emit light according to the first control signal; the driving current being obtained according to the first voltage, the external power source, and a threshold voltage of a driving transistor in the driving unit; the compensation transistor is the first transistor, and the driving transistor is the second transistor.

5. The pixel circuit of claim 4, wherein the driving unit comprises an isolation transistor, a driving transistor and a light emitting control transistor connected in series from the external power source to the light emitting unit through sources and drains;
   gates of the light emitting control transistor and the isolation transistor are configured to receive the first control signal.

6. The pixel circuit of claim 4, further comprising an initialization unit;
   wherein the initialization unit is connected between the first node and the light emitting unit, and the initialization unit is configured to receive a second scan signal and an initialization voltage; and
   the initialization unit is configured to initialize the first node and the light emitting unit using the initialization voltage under a control of the second scan signal.

7. The pixel circuit of claim 4, wherein the second electrode region and the third electrode region are of the same electrical property.

8. The pixel circuit of claim 4, wherein the second electrode region and the third electrode region are symmetrically disposed on two sides of the common gate region.

9. A pixel structure being applied to a pixel circuit, wherein the pixel circuit comprises a common-gate transistor, the common-gate transistor comprises: a first electrode region, a second electrode region, and a third electrode region that are independently disposed, and a common gate region that is in contact with the first electrode region, the second electrode region, and the third electrode region;
   the common gate region, the first electrode region, and the second electrode region constitute a first transistor; and
   the common gate region, the first electrode region, and the third electrode region constitute a second transistor, and
   wherein the pixel circuit further comprises: a compensation unit, a driving unit, a light emitting unit, a capacitor, and an external power source;
   the compensation unit is electrically connected to the driving unit through a first node; the external power source, the driving unit and the light emitting unit are sequentially connected in series; and the capacitor is connected between the first node and the external power source;
   the compensation unit is configured to receive a data signal and a first scan signal, and the compensation unit is configured to set a voltage of the first node to a first voltage in response to the first scan signal, the first voltage being a voltage obtained by compensating a voltage of the data signal by a compensation transistor in the compensation unit;
   the capacitor is configured to maintain the voltage of the first node at the first voltage;
   the driving unit is configured to receive a first control signal, and the driving unit is configured to generate a driving current to drive the light emitting unit to emit light according to the first control signal; the driving current being obtained according to the first voltage, the external power source, and a threshold voltage of a driving transistor in the driving unit; the compensation transistor is the first transistor, and the driving transistor is the second transistor, and
   wherein the pixel structure further comprises:
   a driving-side electrode extension region that extends from the first electrode region of the driving transistor; and a third electrode extension region that extends from the third electrode region;
   wherein the driving-side electrode extension region overlaps with a first control signal line of the first control signal at a gate region of the isolation transistor, and a side of the driving-side electrode extension region away from the common gate region is connected with an external power source signal line of the external power source; and
   the third electrode extension region overlaps with the first control signal line at a gate region of the light emitting control transistor, and a side of the third electrode extension region away from the common gate region is connected with the light emitting unit.

10. The pixel structure of claim 9, wherein a metal plate is disposed above the common gate region; and the metal plate is one of capacitor plates of the capacitor;
    the pixel structure further comprises:
    a compensation-side electrode extension region that extends from the first electrode region of the compensation transistor, and a second electrode extension region that extends from the second electrode region;
    an overlapping region between the compensation-side electrode extension region and a first scan signal line of the first scan signal constitutes a gate region of a data strobe transistor; and a side of the compensation-side electrode extension region away from the common gate region is externally connected with a data signal line of the data signal; and
    an overlapping region between the second electrode extension region and the first scan signal line constitutes a gate region of a switching transistor; and a side of the second electrode extension region of the first scan signal line away from the common gate region is electrically connected to the metal plate.

11. The pixel structure of claim 9, further comprising:
    a driving-side electrode extension region that extends from the first electrode region of the driving transistor; and a third electrode extension region that extends from the third electrode region;
    the driving-side electrode extension region overlaps with a first control signal line of the first control signal at a gate region of the light emitting control transistor, and a side of the driving-side electrode extension region away from the common gate region is connected to the light emitting unit; and
    the third electrode extension region overlaps with the first control signal line at a gate region of the isolation transistor, and a side of the third electrode extension region away from the common gate region is connected to an external power source signal line of the external power source.

12. The pixel structure of claim 11, wherein a metal plate is disposed above the common gate region; and the metal plate is one of capacitor plates of the capacitor;
    the pixel structure further comprises:
    a compensation-side electrode extension region that extends from the first electrode region of the compensation transistor, and a second electrode extension region that extends from the second electrode region;
    an overlapping region between the compensation-side electrode extension region and a first scan signal line of the first scan signal constitutes a gate region of a switching transistor; and a side of the compensation-side electrode extension region away from the common gate region is electrically connected to the metal plate; and
    an overlapping region between the second electrode extension region and the first scan signal line constitutes a gate region of a data strobe transistor; and a side of the second electrode extension region of the first scan signal line away from the common gate region is externally connected to a data signal line of the data signal.

13. The pixel structure of claim 9, wherein the driving unit comprises an isolation transistor, a driving transistor and a light emitting control transistor connected in series from the external power source to the light emitting unit through sources and drains;

gates of the light emitting control transistor and the isolation transistor are configured to receive the first control signal.

14. The pixel structure of claim 9, further comprising an initialization unit;

wherein the initialization unit is connected between the first node and the light emitting unit, and the initialization unit is configured to receive a second scan signal and an initialization voltage; and the initialization unit is configured to initialize the first node and the light emitting unit using the initialization voltage under a control of the second scan signal.

15. The pixel structure of claim 9, wherein the second electrode region and the third electrode region are of the same electrical property.

16. The pixel structure of claim 9, wherein the second electrode region and the third electrode region are symmetrically disposed on two sides of the common gate region.

17. The pixel structure of claim 9, wherein the common gate region comprises a first gate region and a second gate region;

a gate region of the first transistor comprises the first gate region; and a gate region of the second transistor comprises the first gate region and the second gate region.

* * * * *